United States Patent [19]

Stengl et al.

[11] Patent Number: 4,924,104

[45] Date of Patent: May 8, 1990

[54] ION BEAM APPARATUS AND METHOD OF MODIFYING SUBSTRATE

[75] Inventors: Gerhard Stengl, Wernberg; Hans Loschner, Vienna, both of Austria

[73] Assignees: Ims Ionen Mikrofabrikations Systeme Gesellschaft m.b.H; Oesterreichische Investitions-Kredit Aktiengesellschaft, both of Vienna, Austria

[21] Appl. No.: 244,786

[22] Filed: Sep. 9, 1988

Related U.S. Application Data

[63] Continuation of Ser. No. 62,464, May 8, 1987, abandoned.

[30] Foreign Application Priority Data

Sep. 11, 1985 [AT] Austria ............................. A266/85
Sep. 10, 1986 [WO] World Int. Prop.
O. ..................... PCT/AT86/00053

[51] Int. Cl.$^5$ ......................................... H01J 37/08
[52] U.S. Cl. .............................. 250/492.3; 250/398; 250/397; 250/309
[58] Field of Search .............. 250/423 R, 309, 492.21, 250/492.2, 396 R, 397, 398

[56] References Cited

U.S. PATENT DOCUMENTS

| | | |
|---|---|---|
| 3,434,894 | 3/1969 | Gale . |
| 4,139,773 | 2/1979 | Swanson . |
| 4,457,803 | 7/1984 | Takigawa . |
| 4,503,329 | 3/1985 | Yamaguchi et al. . |
| 4,578,587 | 3/1986 | Behringer et al. . |
| 4,683,378 | 7/1987 | Shimase et al. . |
| 4,698,236 | 10/1987 | Kellogg et al. . |

*Primary Examiner*—Bruce C. Anderson
*Attorney, Agent, or Firm*—Herbert Dubno

[57] ABSTRACT

The invention concerns an ion beam apparatus, by means of which defects in a substrate can be recognized, and repaired under continuous control. For this purpose, the ion beam apparatus, in its beams path, after the ion source, is equipped with a mask exhibiting a preferrably circular hole and between ion source and mask with a controllable lens for the purpose of modification of the divergence angle under which the beam strikes the mask. The aperture of the mask is imaged upon the substrate. In this way the intensity of the ion beam may be varied for use in inspecting a substrate for defects and subsequently removing the detected defects.

11 Claims, 2 Drawing Sheets

ION BEAM APPARATUS AND METHOD OF MODIFYING SUBSTRATE

FIELD OF THE INVENTION

This application is a continuation in part of U.S. application Ser. No. 07/062,464 filed May 8, 1987 and entitled "Ion Beam Apparatus and Method of Modifying Substrate." now abandoned, which claims priority from PCT application No. 86/00053, filed Sept. 10, 1986 in turn claiming priority from Austrian application No. A 2661/85, filed Sept. 11, 1985.

This invention relates to an ion beam apparatus for modifying substrates including a source of ions, a lens arranged thereafter in the path of the ions for accelerating the ions and a deflection means for the ions arranged after the lens, which can be realized e.g. as a multipole and in particular as an octopole array. In the region between the ion source and the lens, a mask is positioned with an aperture which may be variable, and this aperture is imageable upon a substrate, reduced in size by means of an ion-optical apparatus.

In the fabrication of microcircuits, patterns which are contained in a mask are transferred upon a coated semiconductor substrate by lithographic methods. For the production of submicrometer structures, and in particular structures in the range from 0.2 to 0.7 um, X-ray lithography with synchrotron radiation appears to be the most promising imaging technique. It is necessary, due to the X-ray imaging technique which operates at the scale of 1:1, to have at one's disposal masks of great stability and dimensional accuracy. It appears that by means of special fabrication techniques, the stringent requirements can also be satisfied with regard to the tolerances of linewidth. However, the fabrication of masks cannot be carried out entirely free of defects and upon positioning and application of the masks, defects can arise. Three types of mask defects occur most frequently, namely, (1) pinholes, or lack of absorbing material in pattern elements, (2) surface defects opaque to X-rays, or surplus of absorbing material upon or between pattern elements, and (3) defects in the carrier foil (e.g. residual Si or BN foils).

The current state of developments makes it possible to correct pinhole type defects by means of laser-induced depositions, and undesirable opaque regions may be corrected by means of sputtering methods. Sputtering is also applicable for the touchup of repaired pinhole defects. Defects in the carrier foil are of little importance for the imaging process with X-rays, particularly where silicone is used as the carrier material for the foil.

For the execution of the repairs, the places to be repaired must first be found, and the type of defect must be ascertained in an inspection step. For this purpose suitable inspection instruments are known based on optical microscopy or electron microscopy which as a result of the above mentioned inspection furnish location coordinates of the defects and also indicate the type of defects found in these locations. Typically, in such instruments, the data ascertained in the inspection step of the mask is compared with an original or a data base.

In order to be able to repair a defect in a mask it is necessary to first find again the location of the defect which had been determined by the inspection instrument, and then to treat the defect. For this purpose ion beam instruments have already been used, such as described by H. Yamaguchi et al. in e.g. EP-OS No. 075 949 and U.S. Pat. No. 4,503,329.

In these known instruments, liquid metal ion sources are used, whereby the ion source is imaged upon the substrate e.g. in a scale of 1:1 by ion-optical means. With such instruments, an ion current density of about 1 A/cm$^2$, sufficient for a repair, can be attained on the substrate. However, the intensity of the ion beam appears to be difficult to regulate over the short term, with the disadvantage that the locating of the defect to be repaired must be effected very rapidly, otherwise the ion beam used for the location of the defect could destroy or at least damage zones free of defects. The necessity of carrying out the step of locating the spot to be repaired as rapidly as possible reduces the accuracy of the determined location, which in the repair of X-ray masks, must meet especially stringent requirements.

Ion beam instruments which are capable of producing reduced images of mask patterns are known e.g. from DE-PS No. 1 615 25 187, and also described by G. Stengl et al in J. Vac. Sci & Technol. 16 (6) 1883, 1979. By means of such an ion-optical arrangement a reduced image can be projected upon a substrate.

SUMMARY OF THE INVENTION

It is the object of the invention to provide an ion beam instrument of the type mentioned above which in particular furnishes a focussed ion beam in such manner that microscopic operation for inspecting a substrate for the location of defects is made possible, where the ion beam can act upon the substrate for any practical duration without the danger that the ion beam apparatus generates additional defects, or that the patterns are changed unduly due to heating or ion sputtering, and then subsequently, after the inspection, the apparatus may remove the defect.

These objects are accomplished according to the invention by providing a method and apparatus for inspecting and modifying a substrate with an ion beam apparatus comprising a duoplasmatron ion source, a lens arrangement in the path of the beam of ions from the source for accelerating and focusing the ions, deflecting means for deflecting the focused beam across the substrate, a mask positioned in the region between the ion source and the lens, the mask having an aperture which is imageable in reduced size upon the substrate by the lens arrangement, and between the ion source and the mask there being a controllable lens constructed and arranged to vary the divergence angle at which the beam of ions reaches the mask, including conducting a substrate inspection by causing the controllable lens to produce a relatively wide divergence angle to illuminate the aperture with a relatively low flux density of ions which form the image of the aperture upon the substrate, and modifying the substrate by causing the controllable lens to produce a narrower beam divergence angle to illuminate the aperture with a relatively high flux density of ions which form the image of the aperture upon the substrate.

In an ion beam apparatus of the type mentioned above, the mask is equipped with a preferrably circular aperture which may be adjustable, the controllable lens being arranged for the reduction of the angle (E) under which the ions leave the ion source. In the application of the apparatus, in the working mode as a microscope, that is during the search for the location of a defect, the circular aperture of the mask is imaged upon the substrate reduced in size by means of an ion-optical arrangement. Changes of the ion source or fluctuations of the position of the ion source affect the image only to a negligibly small extent, since not the ion source, but the aperture in the mask is imaged, reduced in size upon the substrate. The ion source is thus largely uncoupled from further events. It thereby also becomes possible to make the aperture in the mask relatively large (e.g. 1 um diameter) for use in the sub-micrometer range necessary for repair of X-ray masks in which the defects lie, since at an imaging scale of 1:n, an n times smaller ion beam impinges on the substrate.

Preferably, a duoplasmatron ion source is provided which operates with a current density of about 10 $uA/cm^2$. The ions can be for example hydrogen, helium argon or xenon ions. Preferably, the anode of the duoplasmatron ion source has an aperture of 250 um diameter, and the extraction electrode is positioned 0.5 mm below the anode and exhibits a somewhat larger aperture than the anode. The angle of the ion stream is preferably 4° and the ion current is, depending on the type of ions, more than 200 uA. By means of the special configuration of the ion source it is possible to produce a mostly laminar ion stream through the anode aperture, where a size of the virtual ion source of less than 50 um is produced. A further advantage of the duoplasmatron ion source resides in the fact that the ion current can be reduced by a factor of 5 without substantially reducing the size of the virtual ion source. Thereby the microscopy for the location of the defect locations can be carried out with an ion stream of particularly low intensity, so that there is no danger of generating additional defects. The ion energy at the mask amounts preferably to 5-10 keV. By means of the controllable lens which may be, for example, capable of being switched on and off and provided according to the invention, it is possible to change the intensity of the ion stream in a simple manner. By reduction of the angle, an increase in the intensity in the amount of the square of the reduction factor of the angle is achieved. For example, reduction of 1/6 achieves an increase in intensity by a factor of 36. The energy of the ions reaching the substrate, however, may remain unchanged. Thus the application of the ion beam instrument can be varied from microscopy application to repair application simply by increasing the intensity of the ion stream by adjusting the controllable lens. The energization and deenergization of the lens can also thereby be attained sufficiently fast. Switching times of the order of micro-seconds are possible.

Thus, the apparatus can be used as a focused ion repair apparatus. The basis for this application is a focused ion beam tunable in intensity through several orders of magnitude, where with low intensity, in the microscopic mode, the location of pinpointed defects is carried out, and with high intensity the defects can be repaired exactly, since between microscopic mode and repair mode the locational information of the ion stream on the substrate is retained. The narrower the ion stream emanating from the controllable lens becomes, the greater the diameter of the virtual ion source. Thereby, the variation of the angle is to be held to such amount that the ion stream on the substrate changes its diameter only by a tolerable amount. For the microscopy mode one will thereby choose the largest angle (typically 4°).

Changes or repairs on substrates can be carried out with the use of an ion beam apparatus according to the invention in such manner that, after determining the area of the substrate to be repaired, in the microscopic mode, a repair area is located within a work area, and that the work area is scanned with an ion stream, where upon entry of the ion stream into the repair area the intensity of the ion stream by actuation of the controllable lens is increased, and upon leaving the repair area is decreased again and the scanning is continued over the work area by the ion beam which now exhibits reduced intensity again, by actuation of the controllable lens. To increase the effectiveness of the ion beam apparatus according to the invention, the microscopy operation can be carried out with light ions ($H^+$ or $He^+$) and the repair operation with heavy ions ($AR^+$ or $Xe^+$). The changeover between types of ions is effected either by change of the type of gas, or the ion source is fed with a mixture of gases (e.g. hydrogen and argon), from which the desired type of ions is filtered out by a mass analyzer arranged in sequence.

The positional accuracy of the ion stream must be such that the ion stream itself does not cause any defects on the substrate (X-ray mask) to be repaired. The positional accuracy must be commensurate with the narrowest line width of the mask to be repaired and should be better than the maximum tolerable variation of this line width. If for example, the maximum variation of the line width is 20%, then the positional accuracy of 0.1 um is necessary for the repair of masks with 0.5 um wiring pattern, or a positional accuracy of 0.04 um is required for masks with a 0.2 um wiring pattern. Thus the permissible value of the temporal drift of the ion beam which is also related to the duration of the repair is to be held low. A temporal drift of the ion beam can be attained according to the preferred procedure of the present invention amounting to less than 0.1 um for a repair duration of 100 seconds.

With the application of the repair procedure of the invention, a superimposition of repair and microscopy is possible, i.e. a real-time repair of the defects is carried out. Even during the repair, the repair work can be observed, so that can concurrently be determined whether the repair is done in the right place, and is sufficient.

DESCRIPTION OF THE PREFERRED EMBODIMENT

Brief Description of the Drawings

The invention is explained by way of the examples of the following drawings:

In FIG. 1, an ion source 1, producing a stream of ions making up a beam is followed in the direction of the propagation of the beam by an immersion lens 2. This immersion lens is followed by a deflection means for the ions, which in the preferred embodiment is formed by an octopole 3, i.e. eight rods, to which a potential is applied for deflection of the ion rays. Deflection means operating on a magnetic principle may also be considered. In the space between ion source 1 and immersion lens 2 a mask 4 is arranged which exhibits at least one aperture 5. Preferably, the aperture 5 is made circular. The size of the opening can also be made variable using, for example, an iris aperture. The ion stream emanating from ion source 1, constructed as a duoplasmatron ion source, illuminates divergently (angle E, e.g., 4°) mask 4 with an ion energy of preferrably, 5-10 keV. The immersion lens 2 accelerates the ions passing through aperture 5 to a final energy of e.g. 60-90 keV at substrate S, which can, e.g., be an X-ray mask to be repaired. Preferrably hydrogen, helium, argon or xenon ions are used. Between the deflection means 3 and the substrate S, a reducing projection lens system 7 is arranged. The ion beam apparatus is so arranged that a single ray 8 impacts the substrate S. The projection lens system 7 serves to produce an image of mask 4 or rather its aperture 5 in a reduction of 1: n. Preferrably, n is chosen as 10, but n can rise as high as 30. In order to be able to control the intensity of the ion beam, a controllable lens 6 is arranged between the mask 4 and the ion source 6 which, as sketched in the drawing, can be realized as a single lens. By narrowing the beam or reducing the divergence angle of the beam by adjustment of the voltage to the controllable lens, an increase in intensity in the amount of the square of the reduction ratio is attained. If the beam is e.g. compressed to 1/6 of its original angle, which with an original beam diameter of a value of 3 cm amounts to a narrowing to about 5 mm, then the intensity of the beam which passes through the hole in the mask rises to 36 times its original value. A beam of such intensity can be used for repair purposes. The energy of the ions, however, may remain unchanged.

Figure 1:
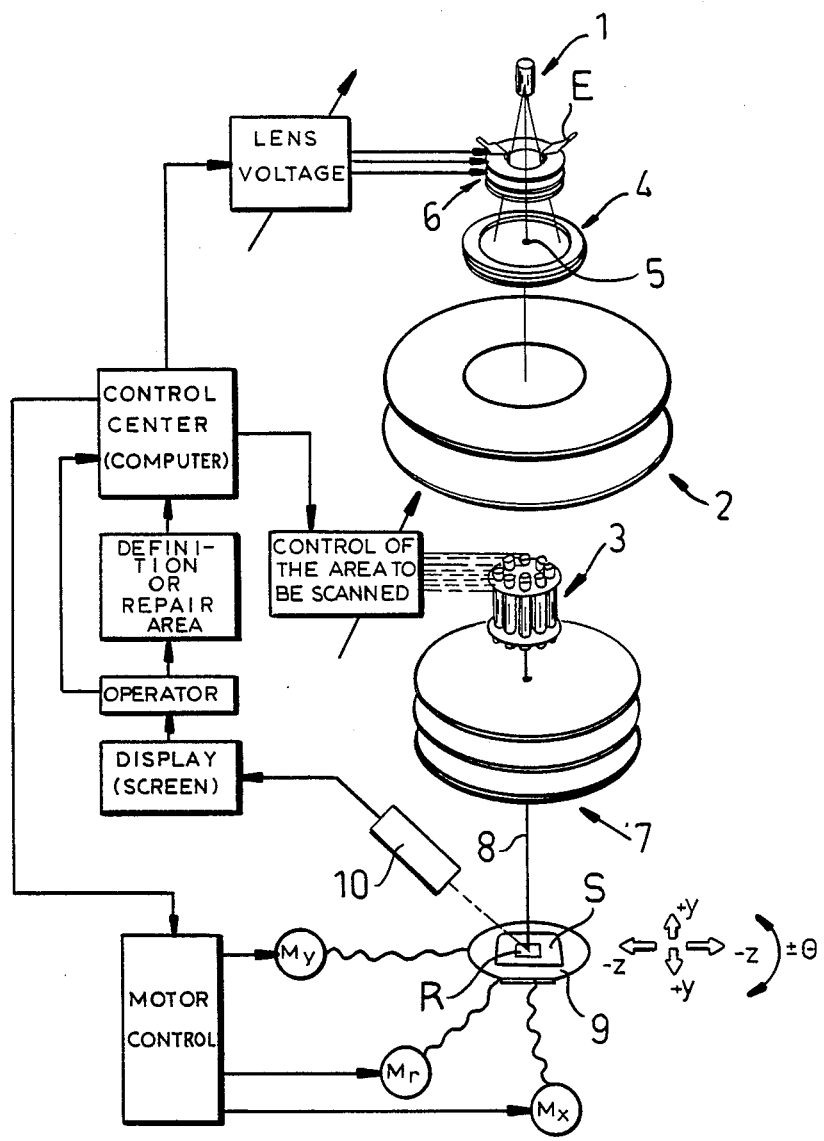
FIG. 1 is a schematic of an ion beam apparatus according to the invention.
Figure 2:
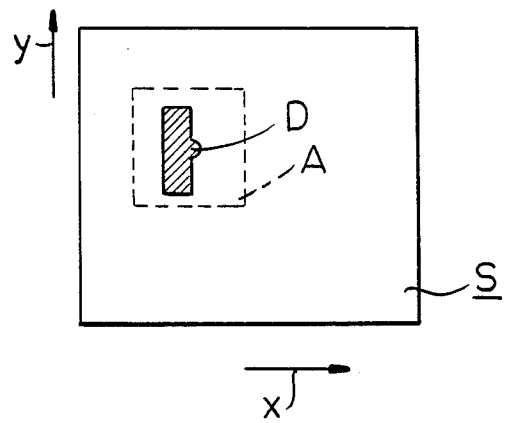
FIGS. 2-4 show a substrate in enlarged scale with a defect, which is repaired by means of an ion beam apparatus equipped according to the invention.
Figure 3:
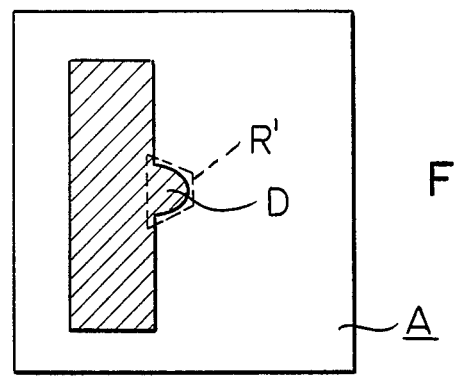
Figure 4:
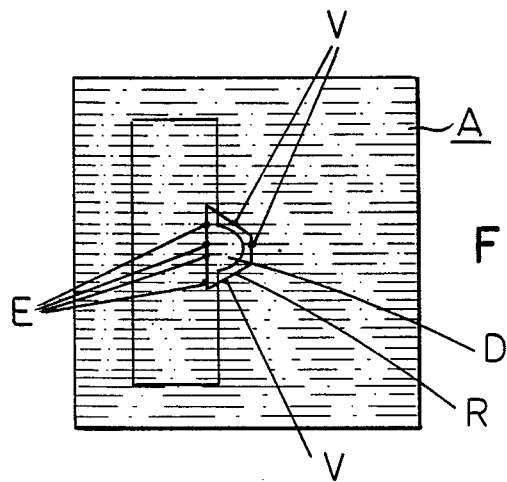

The substrate S lies upon a carriage 9 which can be translated in two mutually perpendicular directions x, y, and may also be rotatable by motors mx, my and mr, respectively. The motors may be activated by a computer controller which accepts the desired target region on the substrate from the operator and locates the substrate accordingly with respect to the beam axis. An ion beam apparatus which is equipped with a mask 4 and a controllable lens 6 can operate in a microscope mode with a deenergized lens 6 and thereby a defect in the substrate can be brought approximately into the range of the ion-optical axis by appropriate movement of the carriage, whereupon the scanning of the defect area is effected by appropriate deflection of the ion beam through activation of the deflection means 3. By the action of a secondary electron or secondary ion signal acquired by means of detector unit 10, the substrate area S (FIG. 2) scanned by ion beam 8 as a consequence of the action of deflection means 3 can be made visible on the screen to, for example, an operator. By movement of carriage 9 the area of defect D is positioned enlargement of the image the work area A (FIG. 3) on the screen becomes visible. The beam size in the work area can be made such that the single ion stream in this space does not exceed a certain size, while for the search for the defect area D over the larger substrate area S a more strongly deflected stream with a greater scan area may be used. By means of operational input by the operator interfacing with a control computer (using, e.g., a light stylus) an appropriate repair area (x,y) e.g. the trapezoid in FIG. 3, can be delineated. The ion beam is then led line for line (dot-and-dash lines) under computer control which controls the deflection means 3 over the work area A (FIG. 4) in such manner that goes beyond the repair area R. The work area remains visible on the screen during the scan. As soon as the moving beam enters the repair area (point E), the controllable lens 6 is activated by the computer to produce an intense substrate-modifying beam according to the parameters set by the operator. As soon as the beam leaves the repair area (point V), the lens 6 is automatically transferred into inactive state by the computer controller and the beam continues to scan with reduced intensity, where the image of the work area A (and of the repair area R) remains visible. In such manner, the image is available while the apparatus works in the repair mode, thereby allowing operator control of the repair if desired. In this manner, "real-time" operation is achieved, where only during the time when the beam scans the repair area R, the image is brighter corresponding to the increased intensity of the beam. However, it is also possible to attenuate the detector signal during the operation of the apparatus in the repair mode, while the beam is in the repair area R, so that a uniform image illumination is achieved over the entire work area. Finally the complete repair work can be checked by operating the apparatus in the microscope mode. If required repair can be carried out anew in the manner described.

What is claimed is:

1. Ion beam apparatus having substrate-inspection and substrate-modifying modes of operation, the apparatus comprising a duoplasmatron ion source, a lens arrangement in the path of the beam of ions from the source for accelerating and focusing the ions, deflecting means for deflecting the focused beam across the substrate, a mask positioned in the region between the ion source and the lens, the mask having an aperture which is imageable in reduced size upon the substrate by the lens arrangement, and between the ion source and the mask there being a controllable lens constructed and arranged to vary the divergence angle at which the beam of ions reaches the mask, in said substrate-inspection mode said controllable lens produces a relatively wide divergence angle to illuminate the aperture with a relatively low flux density of ions which form the image of the aperture upon the substrate, and in said substrate-modifying mode said controllable lens produces a narrower beam divergence angle to illuminate the aperture with a relatively high flux density of ions which form the image of the aperture upon the substrate.

2. The apparatus of claim 1 wherein said aperture is circular.

3. The apparatus of claims 1 or 2 wherein the open area of said aperture is variable.

4. A method for inspecting and modifying a substrate with an ion beam apparatus comprising a duoplasmatron ion source, a lens arrangement in the path of the beam of ions from the source for accelerating and focusing the ions, deflecting means for deflecting the focused beam across the substrate, a mask positioned in the region between the ion source and the lens, the mask having an aperture which is imageable in reduced size upon the substrate by the lens arrangement, and between the ion source and the mask there being a controllable lens constructed and arranged to vary the divergence angle at which the beam of ions reaches the mask, said method including the step of conducting a substrate inspection by causing said controllable lens to produce relatively wide divergence angle to illuminate the aperture with a relatively low flux density of ions which form the image of the aperture upon the substrate, and said method including the step of modifying said substrate in which said controllable lens is caused to produce a narrower beam divergence angle to illuminate the aperture with a relatively high flux density of ions which form the image of the aperture upon the substrate.

5. The method of claim 4 wherein said apparatus is controlled to produce ions of the same energy during said inspection and modifying steps.

6. A method for modifying substrates in an ion beam apparatus comprising the steps of:
   providing an ion beam apparatus, said apparatus arranged to include a source for producing an ion beam,
   a mask with at least one aperture, said mask being imaged onto said substrate by a lens column including first and second lenses to accelerate and project said image of said mask,
   a multipole positioned between said first and second lenses for deflection of said beam in the plane of said substrate and
   a controllable lens positioned between said source and said mask for controlling the divergence angle at which said ion beam reaches the mask,
   said controllable lens operated to decrease the divergence angle of said beam to enhance the intensity of said beam at said substrate during modification of said substrate and said lens operated to increase the angle of said beam to reduce the intensity of said beam of said substrate when not modifying said substrate.

7. The method of claim 6 further comprising scanning said beam on a said substrate.

8. The method of claim 4 or 6 further comprising the steps of
   controlling said controllable lens to reduce the intensity of said beam at said substrate,
   scanning said beam across said substrate,
   providing a detector for detecting the secondary emission flux from said substrate,
   said detector producing signals indicative of the features of said substrate to locate defects on said substrate, and
   controlling said controllable lens to increase the intensity of said beam when said beam scans over a predetermined area of said substrate to affect modification of said substrate over said predetermined area.

9. The method of claim 8 wherein said emission flux is the secondary ion flux.

10. The method of claim 8 wherein said emission flux is the secondary electron flux.

11. The method of claim 4 or 6 further comprising maintaining said aperture at constant diameter between viewing and mask repair conditions.

* * * * *